United States Patent
Satou et al.

(10) Patent No.: US 6,467,056 B1
(45) Date of Patent: Oct. 15, 2002

(54) SEMICONDUCTOR INTEGRATED CIRCUIT AND METHOD OF CHECKING MEMORY

(75) Inventors: Masayuki Satou, Takasaki; Isao Shimizu, Tamamura; Hiroshi Fukiage, Kodaira, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/461,401

(22) Filed: Dec. 15, 1999

Related U.S. Application Data

(62) Division of application No. 09/403,104, filed as application No. PCT/JP98/01731 on Apr. 16, 1998, now Pat. No. 6,233,182.

(30) Foreign Application Priority Data

Apr. 16, 1997 (JP) .............................................. 9-098840
Nov. 27, 1997 (JP) .............................................. 9-326279

(51) Int. Cl.[7] ............................................. G11C 29/00
(52) U.S. Cl. ..................... 714/720; 714/722; 714/733; 365/200; 365/201
(58) Field of Search ........................... 365/230.08, 200, 365/201; 714/718, 30, 738, 719, 722, 720, 733

(56) References Cited

U.S. PATENT DOCUMENTS

| | | | | |
|---|---|---|---|---|
| 5,818,792 A | * | 10/1998 | Sasaki et al. | 365/230.08 |
| 5,825,782 A | * | 10/1998 | Roohparvar | 714/718 |
| 5,966,336 A | * | 10/1999 | Horiguchi et al. | 365/200 |
| 5,991,898 A | * | 11/1999 | Rajski et al. | 714/30 |
| 6,014,336 A | * | 1/2000 | Powell et al. | 365/201 |

FOREIGN PATENT DOCUMENTS

| | | |
|---|---|---|
| JP | 56-169292 | 12/1981 |
| JP | 3-93099 | 4/1991 |
| JP | 4-2000 | 1/1992 |
| JP | 4-17200 | 1/1992 |
| JP | 6-45451 | 2/1994 |

\* cited by examiner

*Primary Examiner*—David Ton
(74) *Attorney, Agent, or Firm*—Mattingly, Stanger & Malur, P.C.

(57) ABSTRACT

A test circuit comprised of a microprogram controlled control unit for generating a test pattern (addresses and data) for each memory in accordance with a predetermined algorithm and reading written data, an arithmetic unit, and data determining means for determinating the read data and outputting the result of determination is provided over a semiconductor chip equipped with a memory.

3 Claims, 11 Drawing Sheets

SEMICONDUCTOR INTEGRATED CIRCUIT AND METHOD OF CHECKING MEMORY

This is a divisional application of U.S. Ser. No. 09/403,104, filed Dec. 15, 1999, now U.S. Pat No. 6,233,182, which is a 371 of PCT/JP98/01731 filed on Apr. 16, 1998.

TECHNICAL FIELD

The present invention relates to a technique for diagnosing a semiconductor integrated circuit (IC) and a technique effective for application to a technique for detecting defective bits in a semiconductor memory. The present invention relates to, for example, a technique effective for use in a semiconductor integrated circuit in which a semiconductor memory, and a test circuit for the semiconductor memory, i.e., a test pattern generator for generating each test pattern are incorporated.

BACKGROUND ART

A system for diagnosing a semiconductor memory such as a semiconductor memory device or the like is carried out by a test device called "memory tester". The memory tester generates test pattern data, and supplies the test pattern data to a semiconductor memory to be tested to thereby write the data into the corresponding memory cell of the semiconductor memory. Thereafter, the data written into the memory cell is read into the memory tester, and the read data and an expected value held within the memory tester are compared, whereby the semiconductor memory is diagnosed.

A procedure for developing a semiconductor memory is performed as shown in FIG. 11. The design of a system is carried out based on specifications of the semiconductor memory to be developed. Further, specific circuit design is performed based on the system design. Various photomasks necessary for the fabrication of the semiconductor memory are produced. Thereafter, a wafer having a plurality of semiconductor memory circuits formed thereon is manufactured through a wafer process in a semiconductor manufacturing process by utilizing the photomasks, and the wafer is cut to a plurality of memory chips. Further, the respective memory chips are sealed with a sealing agent such as a resin, so that they are assembled into a package. A sample (also called "sample chip") is suitably extracted from the semiconductor memories assembled as the package, and the extracted sample is inspected by using the memory tester. Thus, the presence or absence of a faulty component lying within the sample can be detected.

When the faulty component is found out, the result of testing on the sample regarded as the faulty component is analyzed to find out the cause of the failure. In order to avoid the failure, redesign such as system design, circuit design or layout design or the like for the semiconductor memory is carried out. A wafer formed with a plurality of semiconductor memory circuits is manufactured again through the wafer process in the semiconductor fabricating process, based on the redesigned data. The execution of a retest is repeated by the memory tester. The development of the semiconductor memory has been regarded as completed at a stage in which no failure is detected upon testing.

However, in the diagnostic system for supplying the test pattern data generated from the memory tester to the corresponding semiconductor memory as described above, various semiconductor integrated circuit devices (also called "IC") constituting the tester have been manufactured by a manufacturing or production processing technique antecedent to one generation or a few generations as compared with the generation of each. semiconductor memory to be checked. Namely, the minimum values of the fabrication processing dimensions of the respective semiconductor integrated circuit devices constituting the tester are set thicker than those of the semiconductor memory to be checked. Thus, a next-generation or new-generation semiconductor memory is checked or examined by the memory tester comprised of the previous-generation semiconductor integrated circuit devices. Therefore, specifications such as an operating speed, etc. necessary for a memory tester for examining the new-generation semiconductor memory would become very strict. In order to achieve a desired test speed, a plurality of semiconductor integrated circuits respectively having the same function are prepared within the memory tester. A contrivance to make the test speed faster is made by, fore example, constructing a system so that the semiconductor integrated circuits can be parallel-processed. As a result, the memory tester is accompanied by a problem that the system becomes complex in configuration and the size thereof would become inevitably large.

In a logic semiconductor integrated circuit device or the like on the other hand, a logic simulation using a work station is performed at a stage of circuit design and system design prior to a wafer process in a semiconductor manufacturing process and wafer fabrication. Further, a technique for detecting failures in advance has been established. Therefore, the test procedure of the logic semiconductor integrated circuit device has an advantage in that the total interval required to develop it would become short as compared with the test procedure of the aforementioned semiconductor memory, for manufacturing each semiconductor-chip (also called "real chip") corresponding to an actual product and testing it.

However, since test patterns necessary for a logic simulation are different from each other every logic semiconductor integrated circuit devices, much time is required to form the test patterns. Further, there is also inconvenience that since the test patterns are long in the number of steps, the time required to test the real chip becomes long as compared with the test on the real chip by the tester, thereby making it impossible to substantially execute the test.

There may be cases where in the semiconductor memory on the other hand, the numbers of bits of addresses and data simply differ from each other even in the case of the development of a new product and thereby most of generation programs for test patterns do not stand in need of changes. There may be also cases in which the know-how to analyze failures, which has been built up till now, can be utilized. Therefore, it has been tested by the memory tester after the sample chip has been manufactured as described above.

However, the above-described development procedure has a problem in that although the load on the design is small, the time required between redesigning the memory circuit and fabricating the chip once a failure occurs, greatly increases, so that the period for the development of the semiconductor memory would become long.

Further, the above-described developing system has a problem in that since the recent semiconductor memory is complex in its timing condition from a demand for speeding up and a demand for the achievement of an increased or advanced function such as a pipeline operation as in the case of a synchronous dynamic random access memory (hereinafter also called "SDRAM"), a mistake in its design increases and the period for its development becomes long increasingly.

On the other hand, a verifying tool, which has allowed the generation of a test pattern matched with a product's operation with an operating level from an EDA (Engineering Design Automation) bender, has been announced. One example thereof is a verifying tool called "VisualTest" by TSSI Co., Ltd. In the present verifying tool, a procedure for generating each test pattern is inputted in flowchart form by using a workstation or the like, whereby a semiconductor memory represented by circuit design data can be checked. A memory development procedure at the time that the present verifying tool is used, is illustrated in FIG. 12. Incidentally, FIG. 12 has been considered by the present inventors and is not known to date.

As shown in FIG. 12, verification is made using the present verifying tool without fabricating a wafer so that a failure or defect can be detected, whereby an advantage is brought about in that the development period can be greatly reduced.

However, the above-described method needs to create a test pattern as a pattern data file because the verifying tool is a logic verifying tool (logic simulator) called "Verilog" even if an operating level could be described on "VisualTest". Since the test pattern for the semiconductor memory is massive (ranges from a few giga steps to a few mega steps), it is extremely difficult to execute comprehensive verification. There is an extremely high possibility that this will remain at a partial simulation in practice.

On the other hand, the present inventors have discussed a technique called virtual tester to improve a method for testing the semiconductor memory, the logic semiconductor integrated circuit device, etc. This virtual tester technique is not known to date.

The virtual tester considered by the present inventors includes a pattern generator and a simulator. The pattern generator is described in the form of a program capable of being executed on a computer and generates a test pattern for each semiconductor memory in accordance with a predetermined algorithm. The simulator checks for a semiconductor memory on the computer according to the test pattern formed by the pattern generator when logic design data for the semiconductor memory is given thereto.

It is however considered that since the test pattern formed by the pattern generator must be retained in a memory device even in the case of the diagnostic method using the virtual tester, a normal computer system is short of storage capacity and a checking time interval will increase.

On the other hand, a hardware emulator using an FPGA (Field Programmable Gate Array) is known as a method for speeding up logic verification. The hardware emulator is a tool for electrically making a logic configuration of a logic circuit described in an HDL (Hardware Description Language) by using the FPGA and verifying its logic operation from an electrical operation thereof. Since the hardware emulator actually generates a test pattern for each step and verifies it as distinct from the logic simulator such as Verilog, it is not necessary to prepare the test pattern as a file. Therefore, a high-capacity memory device becomes unnecessary. Since the hardware emulator is hardware constructed of an actual electric circuit, it can perform verification faster than the logic simulator by a few hundred to a few thousand times. It is therefore considered that comprehensive verification is made possible by combination with the HDL description of the semiconductor memory.

The present inventors have paid attention to the fact that in a tester, a test pattern generator called ALPG (Algorithmic Memory Pattern Generator) for generating a test pattern for each memory in accordance with a predetermined algorithm is constructed of a logic circuit relatively small in scale and can be described by the HDL, and a technique for developing the HDL description into an IC has been established. The present inventors have carried out an extensive investigation while an idea is being obtained that it might be loaded into a memory chip by further scaling down a hardware scale and a logic circuit scale of the ALPG employed in the tester. As a result, as will be described later, the present inventors have believed firmly that a semiconductor memory equipped with a test circuit can be implemented by adopting the architecture of the ALPG capable of scale down, thus leading to the application of the present invention.

Incidentally, Japanese Patent Application Laid-Open No. Sho 56-169292 is known as a technique for testing a semiconductor memory. Japanese Patent Application Laid-Open No. Sho 56-169292 discloses a technique for writing test data into memory cells while automatically updating each address by an address counter provided over a memory chip, and thereafter reading and verifying the written test data, thereby checking for all the memory cells.

However, in the system wherein the testing address counter is provided on the memory chip, such an all "1" decision or an all "0" decision that data "1" or "0" is written into all the memory cells and thereafter the written data is read and checked, can be performed with efficiency. However, there are known a marching test and an $N^2$ pattern test as memory tests in addition to the all "1" decision and the all "0" decision. A high-accuracy result of diagnosis cannot be obtained unless these are carried out. The address counter-contained system is considered to have a problem that it carries out limited types of decisions alone and thereby a check remains incomplete as it is.

In order to cause the tester to test a memory unit in a semiconductor integrated circuit (logic integrated circuit with a built-in memory) wherein a peripheral logic (logic circuit) is formed over a single semiconductor chip together with the memory (memory unit), a serial/parallel conversion circuit is provided at an input/output portion of the memory. In this case, the serial/parallel conversion circuit and the tester are connected to each other by serial communications during a test period. Thus, a test pattern given in serial form, which is outputted from the tester, is inputted to the memory unit through the serial/parallel conversion circuit. The serial/parallel conversion circuit converts the input test pattern of serial form into parallel data, followed by writing into the memory unit as test data. Thereafter, the data written into the memory unit is read and the read data is converted into serial data, followed by outputting to the outside of the chip. According to this system, there is an advantage that the tester can be utilized and the number of external signal terminals (pins) for inputting the test pattern can be saved for the semiconductor integrated circuit. However, a problem arises in that a test time interval would become long by the time required to perform the serial/parallel conversion.

An object of the present invention is to provide a semiconductor memory diagnostic technique capable of diagnosing a semiconductor memory without manufacturing a real chip.

Another object of the present invention is to provide a memory diagnostic technique capable of shortening a period necessary for the development of a new semiconductor memory.

A further object of the present invention is to. provide a semiconductor memory diagnostic technique capable of performing diagnoses based on various decision methods for an internal memory without having to use an external tester.

A still further object of the present invention is to provide a memory checking method capable of diagnosing a semiconductor memory in a short time.

A still further object of the present invention is to provide a semiconductor memory capable of being diagnosed without providing external terminals (pins) for inputting test patterns and in a short time.

The above, and other objects and novel features of the present invention will become apparent from the description of the present specification and the accompanying drawings.

DISCLOSURE OF THE INVENTION

A summary of a typical one of the inventions disclosed in the present application will be explained as follows:

Namely, a data processing unit used as a test circuit capable of generating a predetermined test pattern according to a command is provided over a semiconductor chip equipped with a memory circuit.

A data processing unit (10) includes, a microprogram controlled control unit (11, 12 and 13) capable of generating a test pattern (addresses and data) for a memory circuit in accordance with a predetermined algorithm and executing control for performing the reading of written data, an address arithmetic unit (14) whose operation is controlled by the control unit and which generates an address to be supplied to a decoder of a memory, a data arithmetic unit (15) whose operation is controlled by the control unit and which generates data to be written into each memory cell to be checked, and a data determination circuit (16) which determines the read data and outputs the result of determination therefrom. The data processing unit (10) does not need to be provided as a dedicated test circuit and is available even for other applications.

The control unit has a command or instruction memory for storing a plurality of commands using the already-existing tester language and a test language. A test pattern (addresses and data) is generated according to the predetermined algorithm defined by the plurality of commands. The tester language can be regarded as an effective instruction or command language for efficiently generating each test pattern including the addresses and data. The tester language is called language generally used in the tester industry and may be used as, for example, a language compatible with a tester language developed by Advantest Co., Ltd. The language descriptive of the predetermined algorithm is not necessarily limited to the tester language. If a command language capable of generating a test pattern including addresses and data is used, then it will be enough for the above language.

The instruction memory can be selected from the already-existing memories such as a dynamic random access memory, a static random access memory, a read only memory, an electrically programmable non-volatile memory device, or an electrically programmable and erasable non-volatile memory device, etc.

The instruction memory may be formed of a non-volatile memory circuit including electrically programmable and electrically erasable non-volatile memory cells, e.g., a flash memory. Thus, the plurality of commands defining the predetermined algorithm is held even in a state in which a circuit's source potential is not supplied. A plurality of commands defining a desired algorithm can be retained in a non-volatile memory cell by rewriting data stored in a non-volatile memory cell as needed. Thus, test patterns can be intentionally changed ever memory products and lots. This is concerned with an increase in the efficiency of a memory check or inspection where specific failure or defect generation patterns can be analogized every products and product lots.

A memory circuit to be checked is defined as the already-existing memory such as a dynamic random access memory, a static random access memory, a read only memory, an electrically programmable non-volatile memory device, or an electrically programmable and erasable non-volatile memory device or the like.

It is desirable to cause the test circuit to have a self-checking function for performing a logic inspection of the test circuit itself.

The semiconductor integrated circuit including the memory circuit includes a redundant circuit having a spare memory row or a spare memory column capable of be replaced by a defective bit, which is provided in the neighborhood of the memory circuit. In this case, the control unit is provided with a self-repairing circuit. The self-repairing circuit has an algorithm for selecting the most suitable spare memory row or spare memory column, based on the result of determination by the data determining means and replacing the defective bit with the selected one and performs address conversion for the replacement of the defective bit in accordance with the algorithm.

Further, in a semiconductor integrated circuit wherein a peripheral logic circuit (logic circuit) is formed over one semiconductor chip together with a memory circuit, the test circuit is constructed so as to have the function of being capable of generating not only a test pattern for a memory unit but also a test pattern for peripheral logic.

According to the above means, diagnoses based on various decision or determination methods can be done without having to use an external tester. It is also unnecessary to provide external terminals (pins) for inputting each test pattern. Further, since the test circuit formed over the same semiconductor chip as the semiconductor memory is constructed of a logic circuit formed by the same manufacturing technology, i.e., the same generation semiconductor process technique as the semiconductor memory, substantially the same operating speed as the semiconductor memory to be tested can be easily implemented. Thus, according to the present invention, the memory can be diagnosed in a short time. Since the parallel processing using the plurality of the same circuits described above becomes unnecessary, the test circuit itself can be reduced in logic scale and circuit scale as compared with the memory tester. Since the test circuit itself is small in logic scale and circuit scale, the formation of the test circuit in on-chip form can be implemented with relative ease.

In order to improve the yield of production of the test circuit portion, wire processing dimensions of the portion of the test circuit may be set larger than those of each memory cell in the memory unit. Thus, the probability that the test circuit portion will become faulty, can be reduced.

BEST MODE FOR CARRYING OUT THE INVENTION

Preferred embodiments of the present invention will hereinafter be described with reference to the accompanying drawings.

Figure 1:
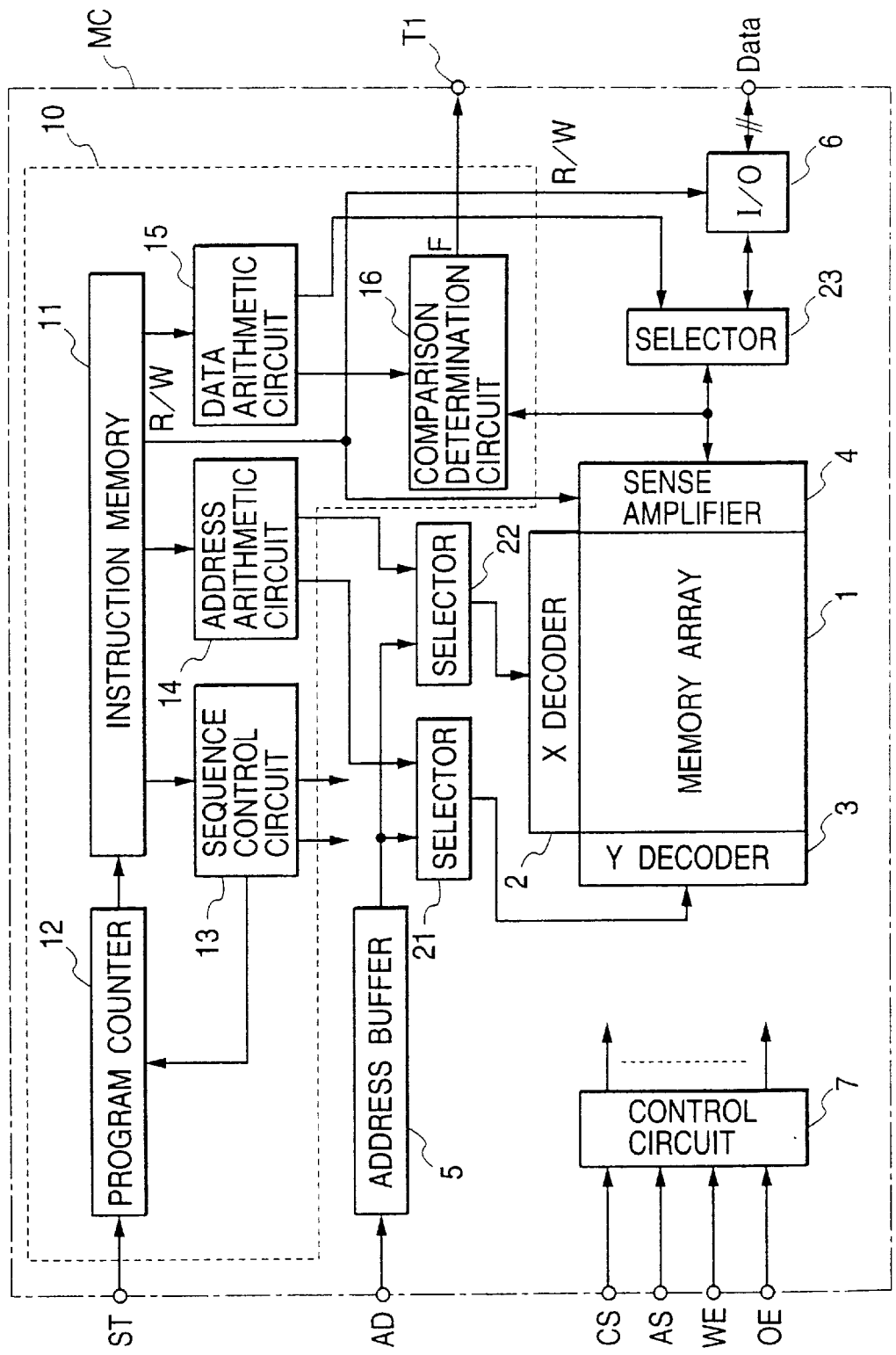
FIG. 1 is a block diagram showing a first embodiment of a semiconductor memory to which the present invention is applied.

FIG. 1 is a block diagram showing one embodiment of a semiconductor memory (memory circuit) to which the present invention is applied.

In FIG. 1, a portion surrounded by a dashed line indicates a semiconductor memory MC formed over a single semiconductor chip like monocrystalline silicon. In FIG. 1, reference numeral 1 indicates a memory array in which word lines and data lines are disposed in lattice or grid form and memory cells are placed in points wherein they intersect respectively. Reference numeral 2 indicates an X decoder and a row decoder for setting one word line lying within the memory array 1 to a selection level, based on an X-system address signal. Reference numeral 3 indicates a Y decoder and a column decoder for selecting a corresponding data line lying within the memory array 1, based on a Y-system address signal. Reference numeral 4 indicates a sense amplifier for amplifying the level of each selected data line. Reference numeral 5 indicates an address buffer for forming an internal address signal in response to an address signal AD supplied from an external terminal indicated by a circular or round mark and supplying it to the X and Y decoders 2 and 3. Reference numeral 6 indicates a data input/output buffer for performing the input and output of write data and read data from and to the outside of the chip through an external terminal. Reference numeral 7 indicates an internal control circuit for forming internal control signals for circuits such as the decoders 2 and 3, sense amplifier 4, address buffer 5, etc. in response to external control signals such as a chip selection signal CS, an address strobe signal AS, a write enable signal WE, an out enable signal OE, etc. inputted from external terminals indicated by round marks and supplying them thereto. It will be easily understood by those skilled in the art that the control signals can be suitably changed according to the type of each memory cell constituting the memory array.

A test circuit (data processing circuit) 10 including a microprogram controlled control unit for generating a test pattern (address and data) for each memory in accordance with a predetermined algorithm and reading written data, an arithmetic unit or part, and data determining means for making a decision or determination as to the read data and outputting the result of determination therefrom is provided over the memory chip MC according to the present embodiment. Incidentally, the test circuit 10 might be described as an ALPG (Algorithmic Memory Pattern Generator) in the present specification.

The addresses and data generated from the test circuit 10 can be supplied to the X decoder 2, Y decoder 3 and sense amplifier 4 through selectors 21, 22 and 23 respectively. The selectors 21, 22 and 23 select either one of the addresses and data outputted from the test circuit 10 or addresses and data inputted from the outside, and supply the selected ones to the X decoder 2, Y decoder 3 and sense amplifier 4, respectively.

The test circuit 10 comprises an instruction memory 11 comprised of an EPROM (electrically programmable non-volatile memory) with a microprogram comprised of a plurality of microcommand groups described in accordance with predetermined test pattern generation algorithms, a flash memory (electrically erasable and programmable non-volatile memory), a ROM (Read Only Memory), a RAM (Random Access Memory, dynamic RAM, static RAM), etc., a program counter 12 for designating or specifying a command address of a microcommand to be read from the instruction memory 11, a sequence control circuit 13 for decoding an instruction or command code lying within the microcommand read from the instruction memory 11 to thereby form or produce control signals for a memory circuit unit and control signals for the internal circuits lying within the test circuit 10, such as the program counter 12, etc., an address arithmetic circuit 14 for generating each test address in accordance with the microcommand read from the instruction memory 11, a test data generation circuit 15 for generating test data and expected value data in accordance with the read microcommand, a comparison determination circuit 16 for comparing the data read from the memory array 1 according to the test address and the expected value data generated from the test data generation circuit 15 and determining whether proper writing has been carried out, etc.

The plurality of microcommands stored in the instruction memory 11 are described using the already-existing tester language and test language. A test pattern (addresses and data) is generated according to each predetermined algorithm defined by the plurality of commands. The tester language is regarded as an effective instruction or command language for efficiently generating each test pattern including the addresses and data. The tester language is called language generally used in the tester industry and may be used as, for example, a language compatible with a tester language developed by Advantest Co., Ltd. This is because program data for the already-existing test pattern can be utilized. The language descriptive of the predetermined algorithm is not necessarily limited to the tester language. If a command language capable of generating a test pattern including addresses and data is used, then it will be enough for the above language.

When the instruction memory 11 is comprised of an EPROM (electrically programmable non-volatile memory), a flash memory (electrically erasable and programmable non-volatile memory) or the like, the writing of each program into the instruction memory 11 is performed by an external writing device such as the known ROM writer or the like.

When the instruction memory 11 is comprised of a ROM (Read Only Memory), the writing of each program into the instruction memory 11 is carried out by the known method in a process for manufacturing a semiconductor memory circuit and a semiconductor integrated circuit to which the present invention is applied.

Further, when the instruction memory 11 is constructed of a volatile memory such as a RAM (Random Access Memory, dynamic RAM, static RAM) or the like, it is necessary to load a program into the instruction memory prior to the execution of a test.

When the semiconductor memory circuit according to the present invention is of a non-volatile memory or the semiconductor integrated circuit according to the present invention includes the non-volatile memory, the program is stored in an address area corresponding to part of the non-volatile memory. Thereafter, the program may be loaded into the instruction memory 11 from the address area for storing the program therein, in response to power-on and a shift to a test mode.

Referring to FIG. 1, the test circuit 10 is started according to a start signal ST for the test circuit. The start signal ST can be defined as a signal generated in response to the input of a source potential to the semiconductor memory circuit and the semiconductor integrated circuit, or a signal intentionally supplied from outside the semiconductor memory circuit and the semiconductor integrated circuit. If the start signal ST is regarded as the signal generated in response to the input of the source potential to the semiconductor memory circuit and the semiconductor integrated circuit, then it can be made available for use in an independently internal-memory checkable application upon applying power to the semiconductor memory circuit and the semiconductor integrated circuit. On the other hand, if the start signal ST is regarded as the signal intentionally supplied from outside the semiconductor memory circuit and the semiconductor integrated circuit, then it can be utilized for applications such as the case where a semiconductor maker and a system maker desire to independently check the semiconductor memory circuit and the semiconductor integrated circuit, etc.

The result of determination by the comparison determination circuit 16 is outputted from an external terminal T1 to the outside of the semiconductor chip as a decision signal F indicative of the coincidence/non-coincidence of data. The test pattern generation algorithms themselves are known to date, and their application makes it unnecessary to provide a novel algorithm for purpose of the present embodiment in particular.

Figure 10:
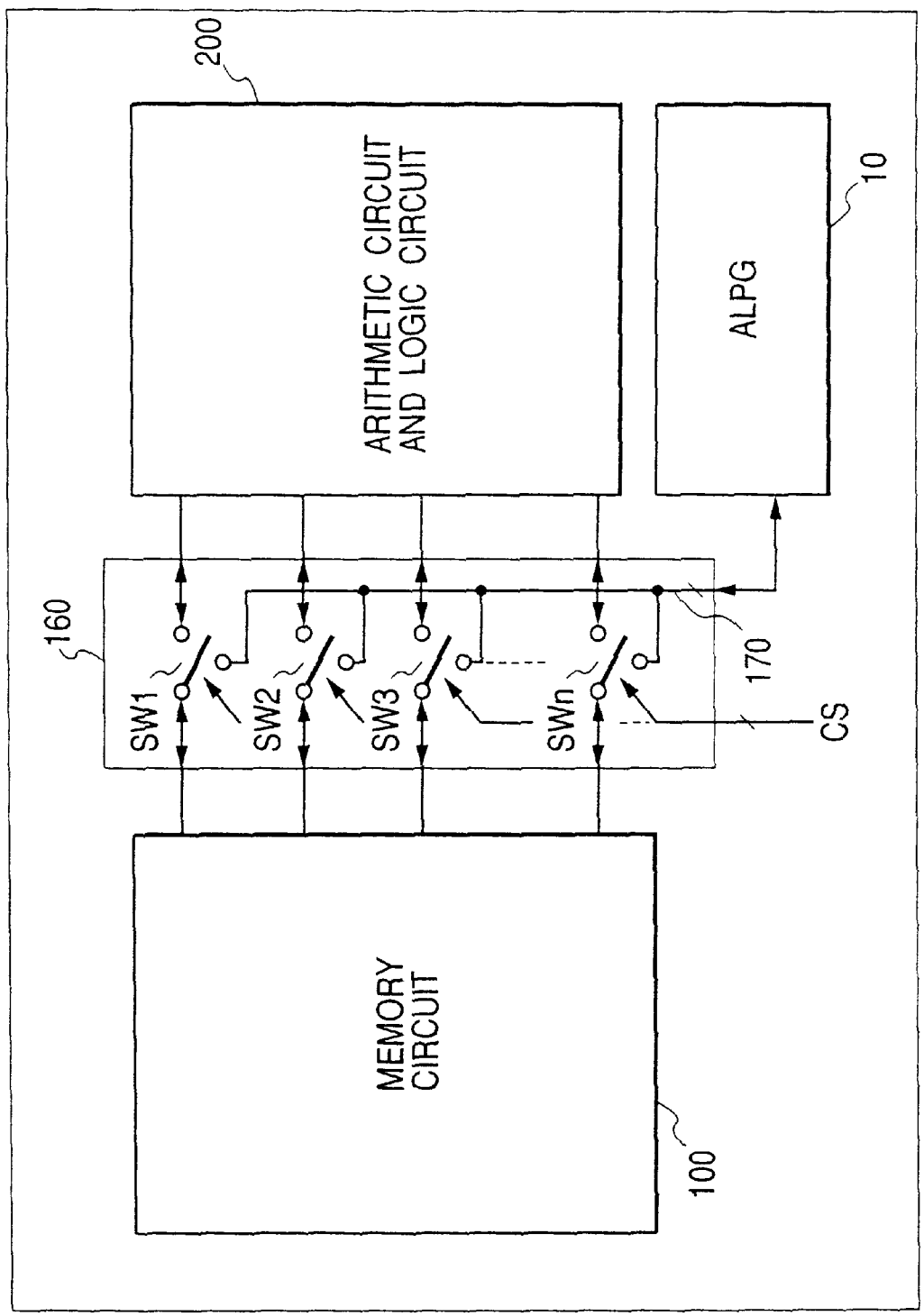
FIG. 10 is a block diagram showing an embodiment of a logic LSI with a built-in memory, to which the present invention is applied.
Figure 11:
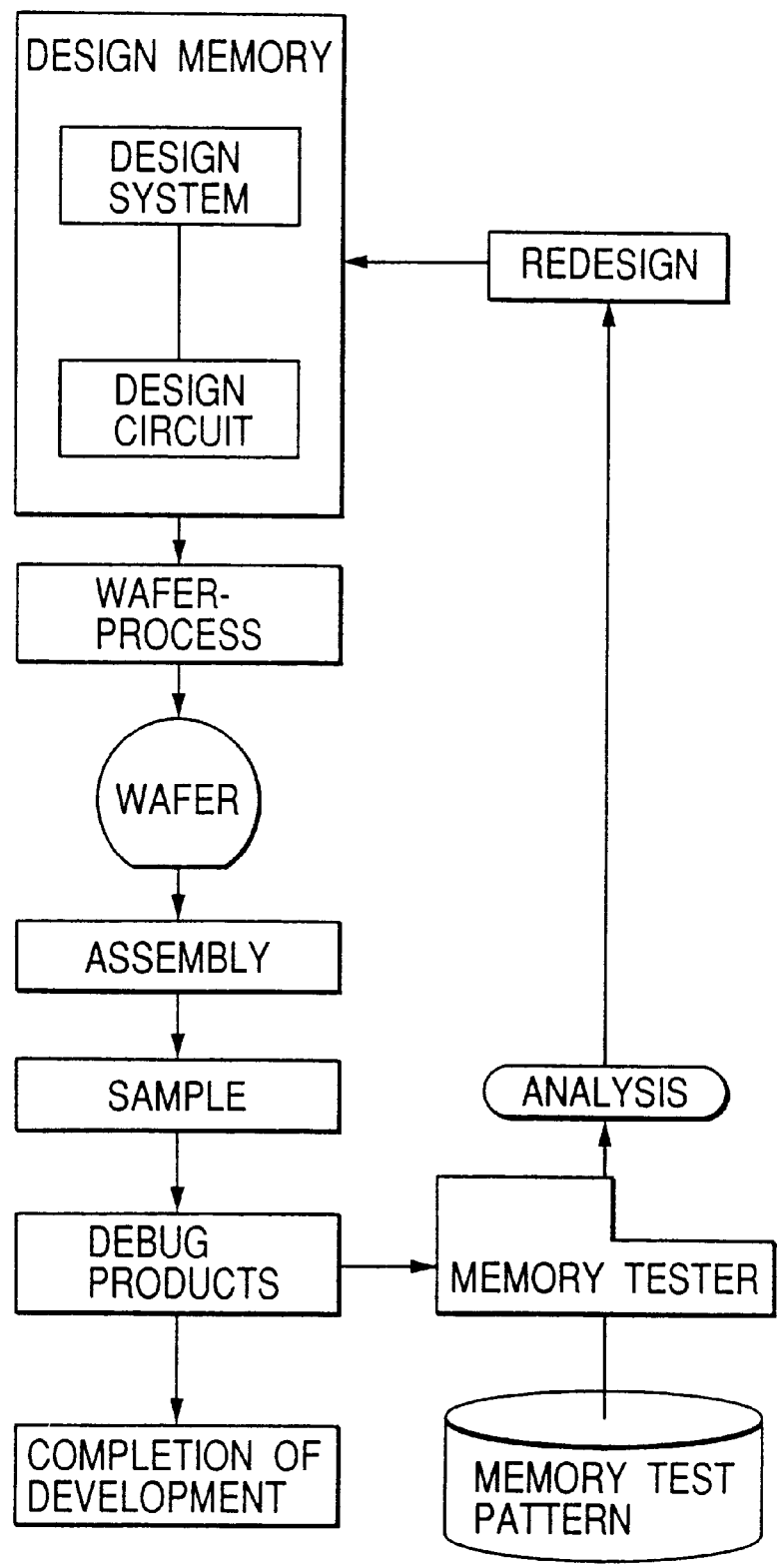
FIG. 11 is a flowchart illustrating a procedure for developing a conventional general semiconductor memory.
Figure 12:
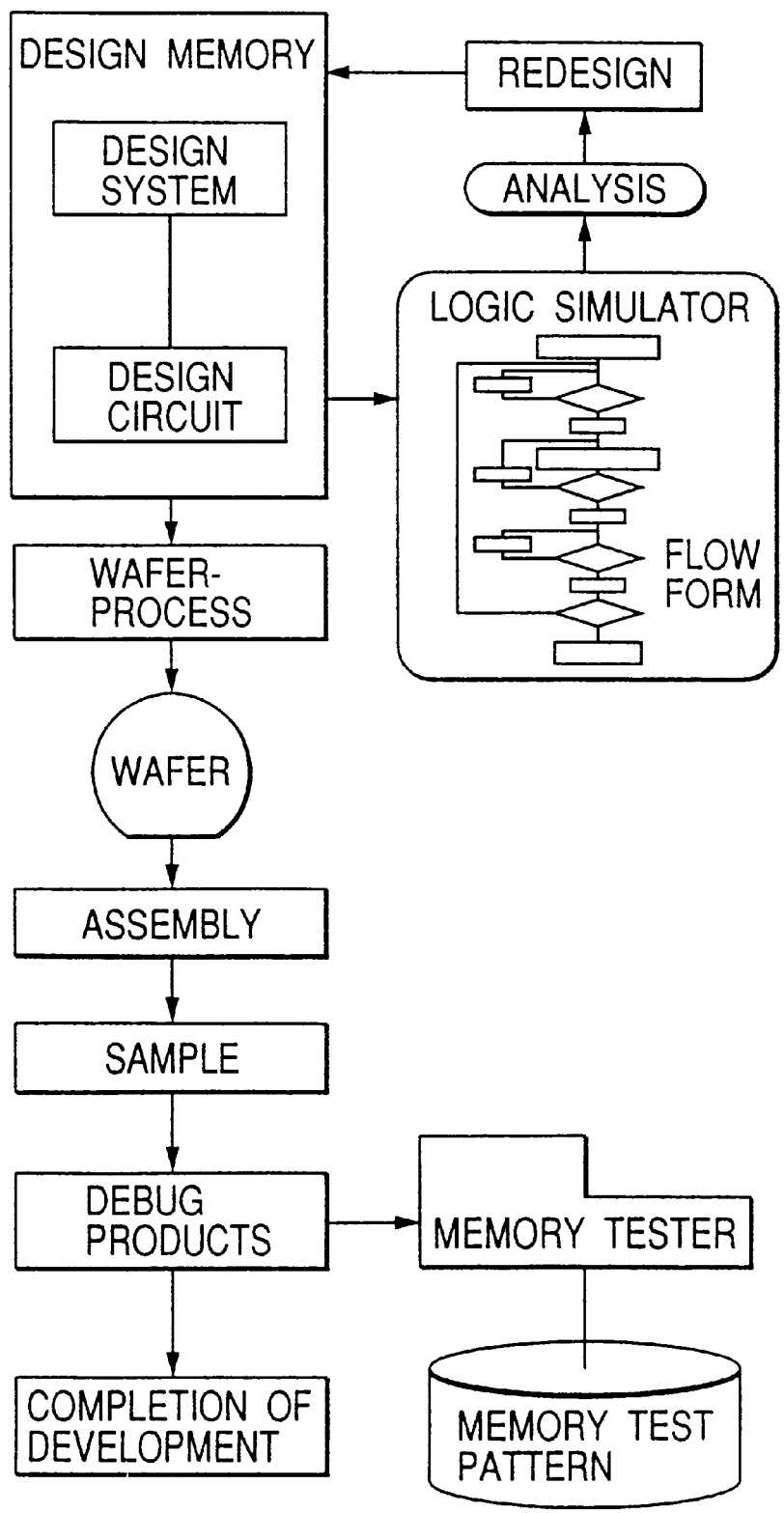
FIG. 12 is a flowchart depicting a procedure for developing a semiconductor memory using a conventional logic simulator.

Incidentally, it is desirable that when the semiconductor integrated circuit (LSI) to which the present embodiment is applied, is provided with an arithmetic circuit and a logic circuit in addition to a memory, a variable bus configuration is adopted wherein a signal switching circuit 160 comprised of a bus 170 and selector switches SW1 through SWn, is provided between a memory circuit 100, and an arithmetic circuit and logic circuit 200 and a test circuit 10 as shown in FIG. 10.

This is equivalent to one which has taken into consideration where a data bus must be controlled so as to vary with respect to an arithmetic circuit and a logic circuit for processing data in the case of a recent image processing memory or the like. When the variable bus configuration is adopted, it is necessary to cause its switch structure to have general versatility. Thus, there is considered an approach for causing a design tool to have data structures of a plurality of variable buses as design data and adding only the required bus structure to each product. Owing to the combination of ALPG structure data according to the present embodiment with the present bus structure data, a designer and a user is capable of easily designing a memory-contained semiconductor integrated circuit LSI having a test function without daring to participate in the design related to the test circuit.

A signal CS for controlling the selector switches SW1 through SWn lying within the signal switching circuit 160 is generated according to the command in the test circuit 10 upon testing the memory circuit and may be supplied to the selector switches SW1 through SWn. A test mode determination circuit for making a decision as to a test mode, based on a test mode designation signal supplied from the outside is provided over the semiconductor chip to thereby determine a test mode designation or indication signal, whereby a switching control signal CS may be formed. Alternatively, a source potential detection circuit for detecting a source voltage level is provided over the semiconductor chip to detect the rising edge of a source voltage Vcc upon power-on, whereby a switching control signal CS may be formed or produced.

Further, the selector switches SW1 through SWn may be constructed so as to be capable of performing not only connection switching between the memory circuit 100 and the arithmetic circuit and logic circuit 200 or between the memory circuit 100 and the test circuit 10 but also a connection between the arithmetic circuit and logic circuit 200 and the test circuit 10. Further, several types of control signals CS are prepared to control the aselector switches SW1 through SWn upon the normal operation of the semiconductor integrated circuit LSI so as to vary the number of signal lines connecting between the memory circuit 100 and the arithmetic circuit and logic circuit 200, whereby a data width or the like may be changed.

Incidentally, the EPROM, ROM and RAM each used as the instruction memory storing the microprogram therein in the present embodiment adopt relaxed device structures as semiconductor design criteria such as wire processing dimensions, etc. at their portions and may take such a consideration that a failure or defect becomes hard to occur in the instruction memory itself. Taking a relaxed device structure as a semiconductor design criterion such as wire processing dimensions at a portion of the test circuit 10 would be best to the entire test circuit 10 as well as the instruction memory. Namely, a semiconductor manufacturing process capable of reducing the rate of occurrence of a failure is applied.

Figure 2:
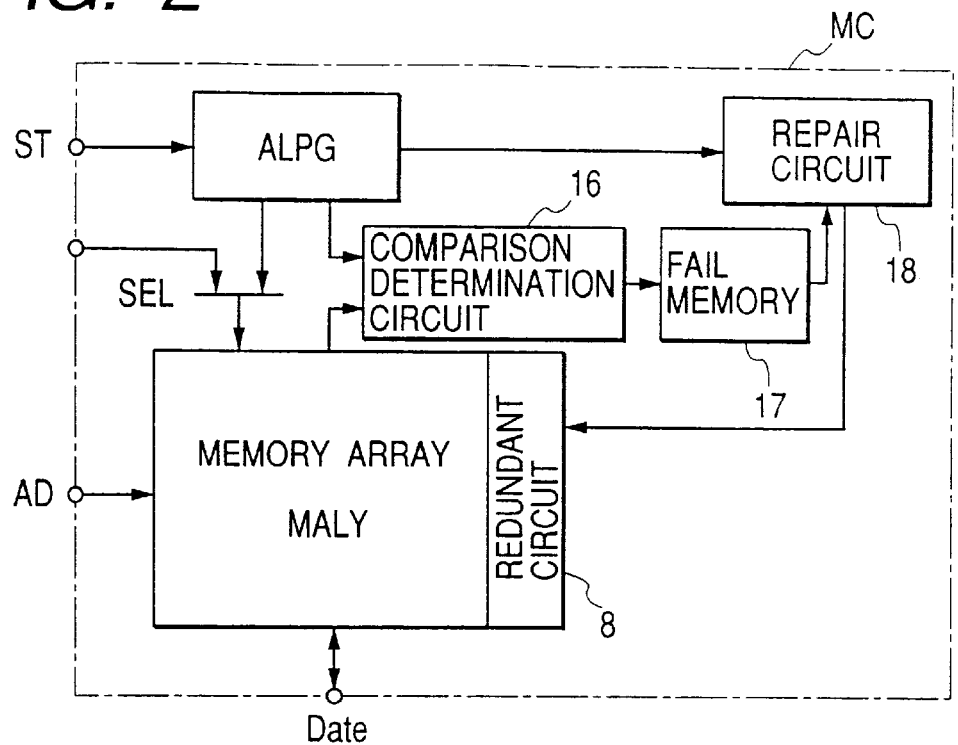
FIG. 2 is a block diagram illustrating a second embodiment of a semiconductor memory to which the present invention is applied.

FIG. 2 is a block diagram of a semiconductor memory MC to which a second embodiment of the present invention is applied.

In addition to the structure of the first embodiment, the semiconductor memory MC according to the present embodiment includes a redundant circuit 8 having a spare memory column or a spare memory row and an address conversion circuit, etc. provided in the neighborhood of the memory array 1, a memory (hereinafter called "fail memory") used as a memory circuit for storing the result of determination by a comparison determination circuit 16, and a healing or repair circuit 18. The repair circuit 18 sets a substitute address to the address conversion circuit provided within the redundant circuit 8 in accordance with the result of determination stored in the fail memory 17 and a predetermined substitute algorithm and thereby replaces a memory column or memory row including faulty memory cells by the optimum spare memory column or memory row.

The repair circuit 18 is constructed in the same manner as the test circuit 10 shown in FIG. 1. Namely, the repair circuit 18 can be comprised of a command or instruction memory storing a microprogram made up of a plurality of microcommand groups described in accordance with a redundancy substitute algorithm, a program counter for designating or specifying a microcommand to be read from the instruction memory, a control circuit for decoding a command code lying within the microcommand read from the instruction memory to thereby form a control signal, an arithmetic circuit, etc.

The most suitable spare memory row or spare memory column is selected based on the result of determination by the comparison determination circuit 16. The redundancy substitute algorithm itself to be replaced by a defective bit is known to date. The use of the redundancy substitute algorithm makes it unnecessary to provide a new substitute algorithm for the present embodiment.

Incidentally, a memory array unit designated at symbol MALY in FIG. 2 corresponds to a circuit portion or unit including the memory array 1, the X and Y decoders 2 and 3, the sense amplifier 4, the address buffer 5, the data I/O buffer 6 and the internal control circuit 7 all shown in FIG. 1. Further, an ALPG indicates a circuit unit including the instruction memory 11, the program counter 12, the sequence control circuit 13, the address arithmetic circuit 14 and the test data generation circuit 15 all shown in FIG. 1. An SEL generally indicates the selectors 21, 22 and 23 shown in FIG. 1.

The fail memory 17 for storing the result of determination therein is provided in the second embodiment. However, when the memory array unit is comprised of a plurality of memory mats or memory blocks, they are checked every memory mats and memory blocks in order. Therefore, when a certain specific one memory mat and memory block are first checked and all the memory cells lying within the specific memory mat and memory block are found not to be abnormal as a result of its check, the specific memory mat and memory block may be used subsequently as a fail memory for checking other memory mats and memory blocks so as to repair or heal defective bits.

Figure 3:
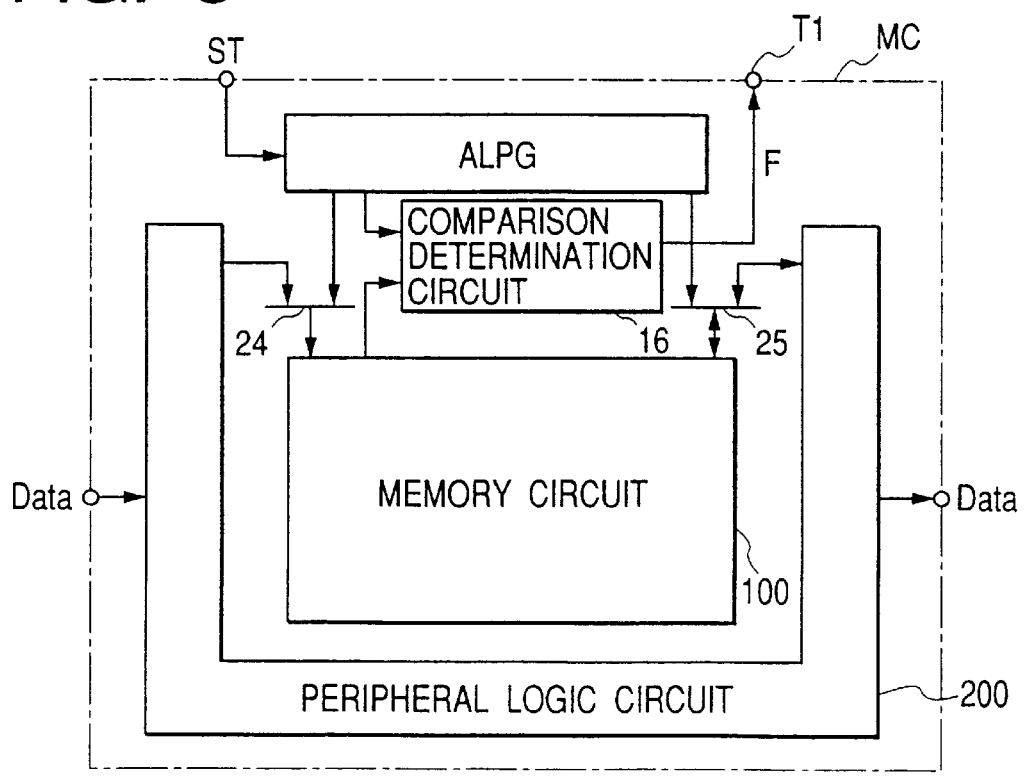
FIG. 3 is a block diagram depicting a second embodiment of a semiconductor memory to which the present invention is applied.

FIG. 3 is a block diagram of a semiconductor memory MC to which a third embodiment of the present invention is applied. The present embodiment is an embodiment in which the present invention is applied to a semiconductor integrated circuit, so-called system memory wherein a peripheral logic circuit 200 is mounted over the same chip together with a memory circuit 100.

In the present embodiment, a selector 24 for selecting either one of an address signal outputted from the peripheral logic circuit 200 and an address signal outputted from a test pattern generator or generation circuit ALPG and supplying it to the memory circuit 100, and a selector 25 for selecting either one of a data signal inputted and outputted to and from the peripheral logic circuit 200 and a data signal outputted from the test pattern generator ALGP are provided over the semiconductor chip.

Even in the case of the present embodiment, a fail memory 17 for storing the result of determination therein and a healing or repair circuit 18 for repairing each defective bit, based on the result of determination may be provided in addition to a test circuit 10 in a manner similar to the second embodiment. Further, the test circuit 10 employed in the present embodiment can be constructed so as to have the function of generating a test pattern and an expected value for the peripheral logic circuit 200, and the peripheral logic circuit can be constructed so that its diagnosis can be also executed by the chip itself.

Figure 4:
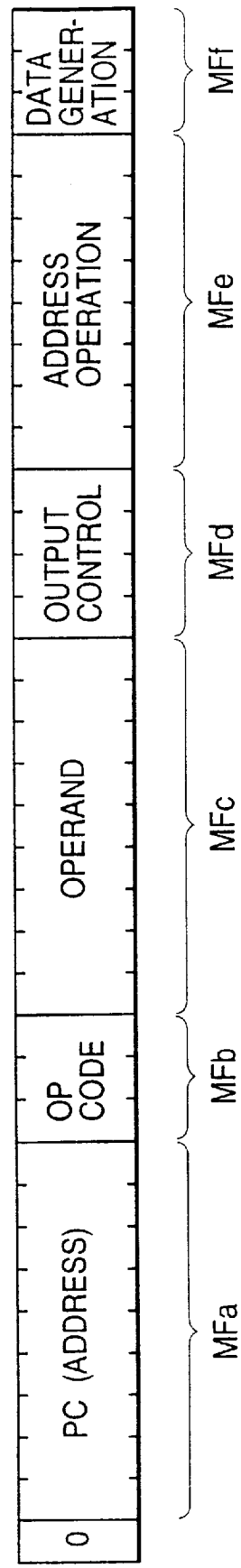
FIG. 4 is an explanatory view showing an example of a format configuration of a microcommand stored in an instruction memory.

FIG. 4 shows an example of a configuration of a command format of the microcommand stored in the instruction memory 11. As described above, the format of the microcommand is based on the tester language.

The microcommand employed in the present embodiment comprises an address field MFa which stores therein each PC address indicative of a command jump destination address used for a jump command, an op code field MFb which stores a sequence control code therein, an operand field MFc which stores the number of command's repetitions, etc. therein, a control field MFd which stores therein control codes for designating the output and read/write of each address and data, an address operation code field MFe which stores an address operation command code therein, a data generation code field MFf which stores a data generation command code therein, etc. The address field MFa is regarded as a field for defining an address for a command to be next executed.

The microcommand defined as the tester language employed in the present embodiment is characterized in that testing address and data computations or operations are designated by one instruction or command so that the two operations are executed in parallel.

Figure 5:
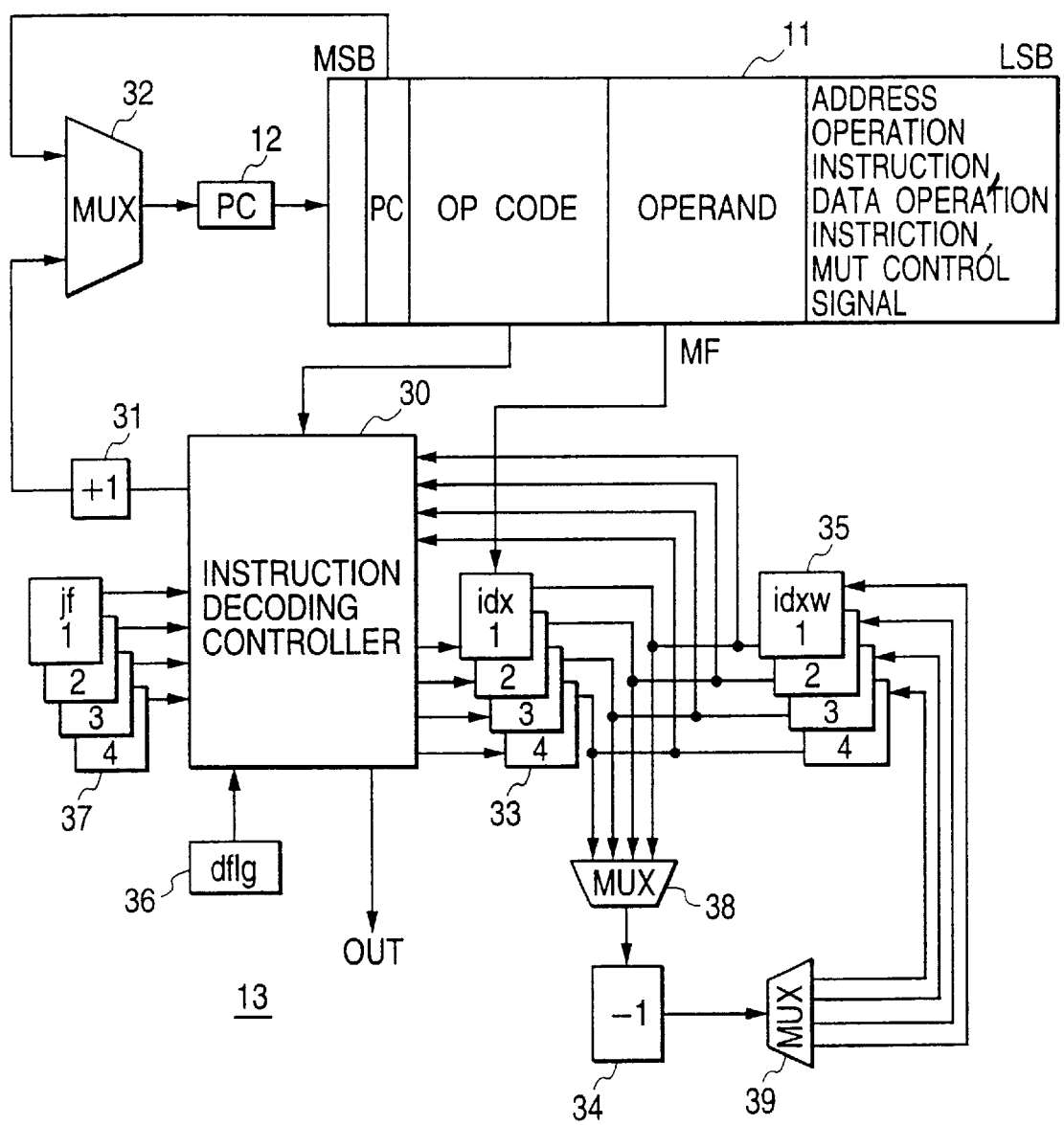
FIG. 5 is a block diagram illustrating an example of a configuration of a sequence controller.

FIG. 5 shows an example of a configuration of the sequence control circuit 13. The sequence control circuit 13 according to the present embodiment comprises an instruction or command decoding controller 30 comprised of a decoder or the like for decoding a control code in the op code filed MFb to thereby form a control signal, an incrementer 31 for incrementing the value of a program counter 12 by "+1", a multiplexer 32 for selecting the value of the incrementer 31 or any of the jump destination addresses in the address field MFa and supplying it to the program counter 12, a plurality of index registers 33 for holding the number of repetitions in the operand field MFc, a decrementer 34 for decrementing the value of each index register 33 by "−1", a plurality of working registers 35 comprised of planes or ways, which hold the values decremented by "−1" respectively, a flag 36 indicative of the presence or absence of data reversal used in jxd commands (see Table 1) to be described later, a plurality of flags 37 indicative of the presence or absence of the transfer of operands used in jindex commands to the program counter 12, a plurality of multiplexers 38 for selectively supplying the values of the registers 33 and 35 to the decrementer 34, and a demultiplexer 39 for distributing the value of the decrementer 34 to any plane of the working registers 35.

The type of op code and the contents thereof used for the sequence control, which are stored in the op code field MFb lying within the microcommand regularly and in description form, are shown in Table 1.

TABLE 1

| Command | Operation |
|---|---|
| nop | PC+1 → PC |
| jindex1 | jindexn(n=1 to 4) operand |
|  | jfn=0  operand → PC |
| jindex2 | idxn  → idx |

TABLE 1-continued

| Command | Operation |
| --- | --- |
| jindex3 | idx → idxwn |
|  | 1 → jfn |
|  | jfn=1 idxwn=0 PC+1 →PC |
| jindex4 | 0 → jfn |
|  | idxwn≠0 operand → PC |
|  | idxwn →idx |
|  | idx-1 →idxwn |
| jxd | jxd operand |
|  | dflg=0 operand → PC |
|  | 1 → dflg |
|  | dflg ≠ 0 PC+1 → PC |
| jmp | 0 → dflg |
|  | jmp operand |
|  | operand → PC |
| stop |  |
|  | stop |

In Table 1, a command indicated by "nop" is an non-operation command for indicating that the value of the program counter 12 is incremented by "+1" by the incrementer 31, followed by return to the program counter 12, i.e., a command for giving instructions for a shift to the next command without performing any operations except for the updating of the program counter.

Further, "jindex1" through "jindex4" are commands prepared to pass a jump-based command loop. There may be cases where upon execution of a pattern test for a memory, the number of commands, i.e., a program length can be reduced by repeatedly executing the same command any number of times by using the jump command (e.g., where addresses are incremented up to the final address and "1" is written into all the memory cells in this state and read out therefrom). In the present embodiment, the index registers 33 are provided so that the number of times this loop (jump) is executed, can be set. Further, the jump commands, the index registers 33 and the working registers 35 are respectively provided four by four to allow the execution of a plurality of types of determination modes.

Since each individual jump commands are identical to one another in control contents, a control operation based on "jindex1" will be described below and other jump commands "jindex2" through "jindex4" will be omitted. When the jindex1 command is read from the op code field MFb, it is determined whether it is the first or initial jindex1 command, and the result of determination is reflected on its corresponding flag 37. Described specifically, when it is the initial jindex1 command, the flagjf1=0, and when it is the second and later, the flagjf1=1.

When the jindex1 command is read when the flagjf1=0, the multiplexer 32 is controlled so that a PC address defined as a jump destination address lying within the address field MFa of the microcommand is set to the program counter 12. Thus, an execution sequence for the microcommand is jumped to that address and the flagjf1 is set to "1". Simultaneously with this, the number of times the loop is executed, which is defined within the operand field MFc, is read into its corresponding idx of each index register 33.

When the jindex1 command is read when the flagjf1=1, the PC address lying within the address field MFa of the microcommand is set to the program counter 12. Further, the number of times the loop is executed, which lies within idx1 of the index register 33, is supplied to the decrementer 34 through the multiplexer 38, where it is decremented by "−1". The decremented value is stored in its corresponding idxw1 of the working register 35 through the demultiplexer 39.

When the idxw1 of the working register 35 is brought to "0", the multiplexer 32 is controlled such that the corresponding address of the program counter 12 is incremented by "+1" by the incrementer 31 in place of the setting of the PC address lying within the address field MFa of the microcommand to the program counter 12, followed by returning to the program counter 12.

Thus, when the jindex command is defined and described in the op code field MFb of the microcommand and the PC address set as the jump destination address of the microcommand is defined and described in the address field MFa, the same jindex command is repeatedly executed by the number of times the loop is executed, which is designated within the operand field MFc. Finally, the program counter 12 is incremented and proceeds to the next microcommand, where such control that it escapes from the loop is performed.

Further, the "jxd" command described in Table 1 is defined as a command for referring to dflg lying within the flag 36 and controlling the value of the program counter according to the value of the dflg flag.

When the dflg flag lying within the flag 36 is given as a first value like "0", the "jxd" command transfers an operand to the program counter, causes a program to jump to a command for a jump destination address indicated by the operand, and sets the dflg flag to a second value like "1". On the other hand, when the dflg flag is given as the second value like "1", the "jxd" command increments the value of the program counter, feeds back the incremented value to the program counter, and resets the dflg flag to the first value like "0".

The "jmp" command is a command for transferring an operand to the program counter and giving instructions for jumping a program to a command for a jump destination address indicated by the operand.

The "stop" command is a stop command for giving instructions for the termination of sequence control.

Figure 6:
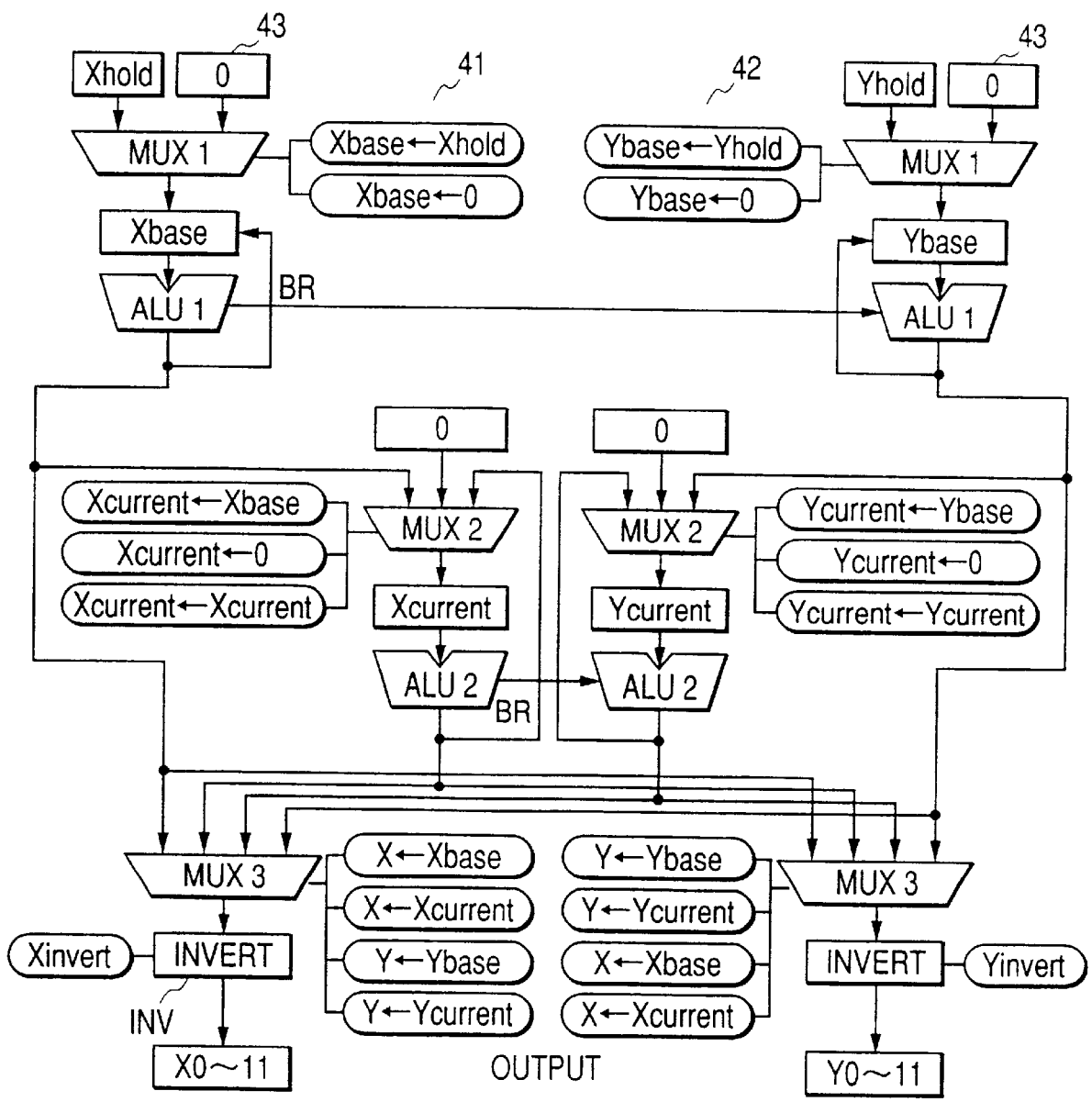
FIG. 6 is a block diagram depicting an example of a configuration of an address arithmetic unit.

FIG. 6 shows an example of a configuration of the address arithmetic circuit 14.

The address arithmetic circuit 14 employed in the present embodiment comprises an X address arithmetic part 41 for generating an X address, and a Y address arithmetic part 42 for generating a Y address in large parts. Since the X address arithmetic part 41 and the Y address arithmetic part 42 are identical in configuration to each other, the configuration of the X address arithmetic part 41 will be explained below and the description of the configuration of the Y address arithmetic part 42 will therefore be omitted. An additional Z address arithmetic unit or part can be provided as needed so as to generate a fractional pattern (partial pattern).

The X address arithmetic part 41 comprises zero setting means 43 for holding an initial value register X hold for storing an initial value of an X address, and "0", a multiplexer MUX1 for selecting either the initial value of the X address or "0", a base register Xbase for holding the selected initial value or "0", a first arithmetic and logic unit ALU1 for adding values stored in the register base, a second multiplexer MUX2 for selecting either the result of operation by the arithmetic and logic unit ALU1, "0" or a feedback value, a current register Xcurrent for retaining each selected value, a second arithmetic and logic unit ALU2 for performing addition and subtraction on the values of the register Xcurrent, a third multiplexer MUX3 for selecting either the output of the second arithmetic and logic unit ALU2 or the output of the first arithmetic and logic unit ALU1, and an inverter INV capable of inverting the selected output.

The inverter INV is provided because there is a case in which a malfunction of an address signal due to switching noise is tested upon a pattern test of a memory, and it is necessary to output the inverse of the address signal in that case. The use of the inverter INV makes it easy to form the inverse of the address signal upon the above test.

In the present embodiment although not restricted in particular, the respective third multiplexers MUX3 are constructed so that the X addresses generated by the arithmetic and logic units ALU1 and ALU2 of the X address arithmetic part 41 can be outputted to the Y address side and the Y address generated by the Y address arithmetic part 42 can be outputted to the X address side.

Thus, the present embodiment is constructed so as to be capable of being used even as any test circuits of a plurality of types of memories, e.g., an address multiplex type memory and an address non-multiplex type memory. Namely, test patterns necessary for all the memories can be generated and checked wit respect to all the memories by simply rewriting the microcommand stored in the instruction memory 11.

Incidentally, the X address arithmetic part 41 and the Y address arithmetic part 42 are different from each other in that when the first arithmetic and logic unit ALU1 of the X address arithmetic part 41 is overflowed, a borrow signal BR is supplied to the first arithmetic and logic unit ALU1 of the Y address arithmetic part 42.

Table 2 shows the type of operation code to be used for Y address operations or computations (base computations) at the first arithmetic and logic unit ALU1 of the Y address arithmetic part 42, which are described, and defined and stored in the arithmetic code field MFe lying within the microcommand, and the contents thereof.

In Table 2, Ybase←0 is a command for giving instructions for setting the value of the base register Ybase to "0". Ybase←Yhold is a command for giving instructions for inputting the contents of the initial value register Yhold to the base register Ybase. Ybase←Ybase+1 is a command for incrementing the value of the base register Ybase by (+1) and returning it to the register Ybase. Ybase←Ybase+1 (BR) is a command for giving instructions for holding the value of Ybase as it is if the value of the base register Xbase is not a maximum value, and incrementing the value of Ybase if the value of the base register Xbase is the maximum value and returning it to the register Ybase. At this time, a borrow signal BR is supplied from the first arithmetic and logic unit ALU1 to the second arithmetic and logic unit ALU2.

The type of operation code to be used for address operations or computations at the first arithmetic and logic unit ALU1 of the X address arithmetic part 41, and the contents thereof are shown in Table 3.

The type of operation code to be used for Y address operations or computations (current computations) at the second arithmetic and logic unit ALU2 of the Y address arithmetic part 42, and the contents thereof are shown in Table 4.

The type of operation code to be used for address operations or computations at the second arithmetic and logic unit ALU2 of the X address arithmetic part 41, and the contents thereof are shown in Table 5.

In Table 4, the column on the left side is an ALPG description described by using a tester language, whereas the column on the right side is a functional operation level description (HDL description) corresponding thereto.

TABLE 2

| Ybase computation | Operation |
|---|---|
| Ybase←Ybase | Non Operation |
| Ybase←0 | 0→Ybase |
| Ybase←Yhold | Yhold→Ybase |
| Ybase←Ybase+1 | Ybase−1→Ybase |
| Ybase←Ybase−1 | Ybase−1→Ybase |
| Ybase←Ybase+1(BR) | Xbase≠XMAX Ybase→YBase |
|  | Xbase=XMAX Ybase+1→Ybase |
| Ybase←Ybase−1(BR) | Xbase≠XMAX Ybase→YBbase |
|  | Xbase=XMAX Ybase−1→Ybase |
| Ybase←Ybase+(B | Xbase≠XMAX Ybase+1→Ybase |
|  | Xbase=XMAX Ybase+2→Ybase |
| Ybase←Ybase−(BR) | Xbase≠XMAX Ybase−1→Ybase |
|  | Xbase=XMAX Ybase−2→Ybase |

TABLE 3

| Xbase computation | Operation |
|---|---|
| Xbase←Xbase | Non Operation |
| Xbase←0 | 0→Xbase |
| Xbase←Xhold | Xhold→Xbase |
| Xbase←Xbase+1 | Xbase+1→Xbase |
| Xbase←Xbase−1 | Xbase−1→Xbase |

| Ycurrent computation | Operation |
|---|---|
| Ycurrent←Ycurrent | Non Operation |
| Ycurrent←Ybase | Ybase→Ycurrent |
| Ycurrent'←0 | 0→Ycurrent |
| Ycurrent←Ycurrent + 1 | YC + 1→YC |
| Ycurrent←Ybase + 1 | YB + 1→YC |
| Ycurrent←Ycurrent − 1 | YC − 1→YC |
| Ycurrent←YBbase1 | Ybase − 1→Ycurrent |
| Ycurrent←Ycurrent + 1 (BR) | Xbase ≠ XMAX Ycurrent + 1→Ycurrent, XBase = XMAX Ycurrent + 2→Ycurrent |
| Ycurrent←Ybase + 1 (BX) | Xbase ≠ XMAX Ybase + 1→Ycurrent, Xbase = XMAX Ybase + 2→Ycurrent |
| Ycurrent←Ycurrent − 1 (BR) | Xbase ≠ XMAX Ycurrent − 1→Ycurrent, Xbase = XMAX Ycurrent − 2→Ycurrent |
| Ycurrent←Ybase − 1(BR) | Xbase ≠ XMAX Ybase − 1→Ycurrent Xbase = XMAX Ybase − 2→Ycurrent |
| Ycurrent←Ycurrent + 1 (BR) | Xcurrent ≠ XMAX Ycurrent + 1→Ycurrent, Xcurrent ≠ XMAX Ycurrent + 2→Ycurrent |
| Ycurrent←Ybase + 1 (BR) | Xcurrent ≠ XMAX Ybase + 1→Ycurrent, Xcurrent = XMAX Ybase + 2→Ycurrent |

-continued

| Ycurrent computation | Operation |
|---|---|
| Ycurrent←Ycurrent − 1 (BR) | Xcurrent ≠ XMAX Ycurrent − 1→Ycurrent, Xcurrent = XMAX Ycurrent 2→Ycurrent |
| Ycurrent←Ybase − 1 (BR) | Xcurrent ≠ XMAX Ybase − 1→Ycurrent, Xcurrent = XMAX Ybase − 2→Ycurrent |
| Ycurrent←Ycurrent + 1 (BR) | Xbase ≠ XMAX Ycurrent→Ycrrent, Xbase = XMAX Ycurrent + 1→Ycurrent |
| Ycurrent←Ybase + 1 (BR) | Xbsae ≠ XMAX Ybase→Ycurrent, Xbase = XMAX Ybase + 1→Ycurrent |
| Ycurrent←Ycurrent − 1 (BR) | Xbase ≠ XMAX Ycurrent→Ycurrent, Xbase = XMAX Ycurrent − 1→Ycurrent |
| Ycurrent←Ybase − 1 (BR) | Xbase ≠ XMAX Ybase→Ycurrent, Xbase = XMAX Ybase − 1→Ycurrent |
| Ycurrent←Ycurrent + 1 (BR) | Xcurrent ≠ XMAX Ycurrent→Ycurrent, Xcurrent = XMAX Ycurrent − 1→Ycurrent |
| Ycurrent←Ybase + 1 (BR) | Xcurrent ≠ XMAX Ybase→Ycurrent, Xcurrent = XMAX Ybase + 1→Ycurrent |
| Ycurrent←Ycurrent − 1 (BR) | Xcurrent ≠ XMAX Ycurrent→Ycurrent, Xcurrent = XMAX Ycurrent − 1→Ycurrent |
| Ycurrent←Ybase − 1 (BR) | Xcurrent ≠ XMAX Ybase→Ycurrent, Xcurrent = XMAX Ybase − 1→Ycurrent |

TABLE 5

| Xcurrent computation | Operation |
|---|---|
| Xcurrent←Xcurrent | Non Operation |
| Xcurrent←Xbase | Xbase→Xcurrent |
| Xcurrent←0 | 0→Xcurrent |
| Xcurrent←Xcurrent−1 | Xcurrent+1→Xcurrent |
| Xcurrent←Xbase+1 | Xbase+1→Xcurrent |
| Xcurrent←Xcurrent−1 | Xcurrent−1→Xcurrent |
| Xcurrent←Xbase−1 | Xbase−1→Xcurrent |

Figure 7:
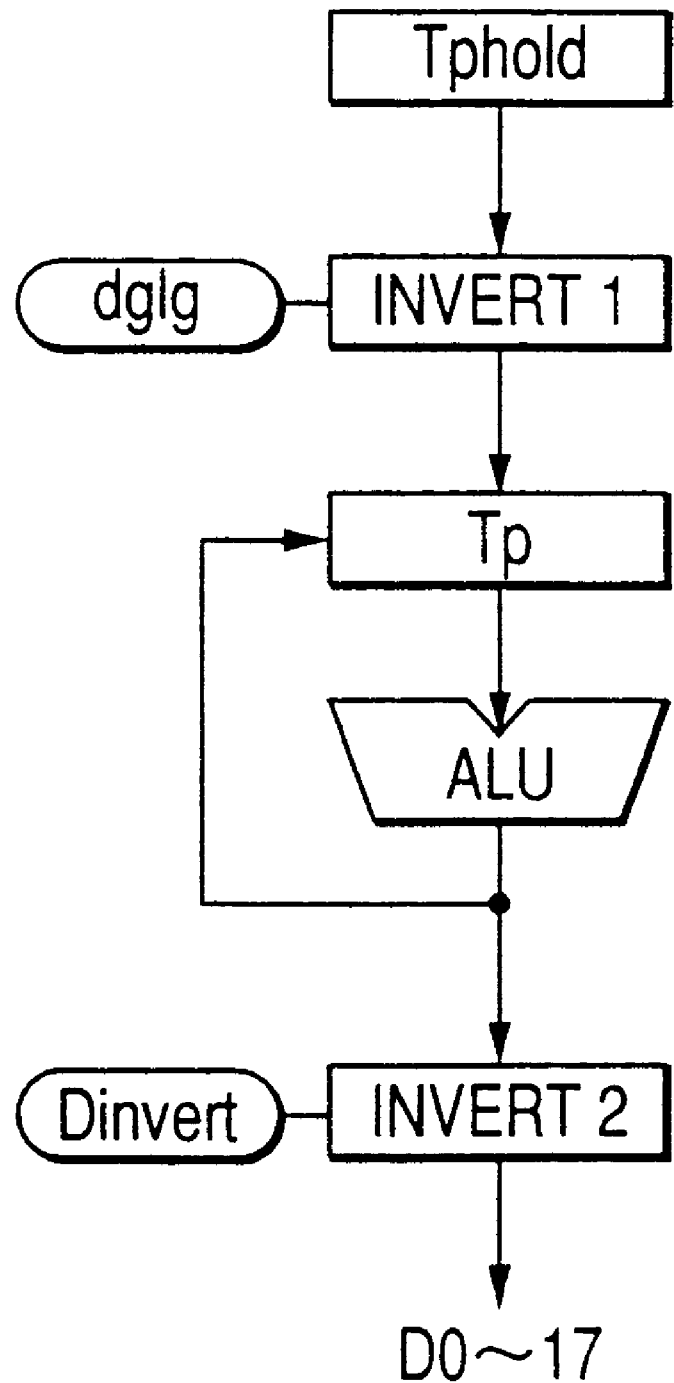
FIG. 7 is a block diagram showing an example of a configuration of a test data generation arithmetic unit.

FIG. 7 shows an example of a configuration of the test data generation circuit 15.

The test data generation circuit 15 employed in the present embodiment comprises an initial value register Tphold for storing an initial value of write data or an expected value therein, an inverter INVERT1 capable of inverting the value stored in the initial value register Tphold, a base data register Tp for holding reference or base data of test data or an expected value to be outputted, an arithmetic and logic unit ALU having a bit shift function, and an inverter INVERT2 capable of inverting the output of the arithmetic and logic unit ALU. While the bit width has been set to 18 bits in the present embodiment, the test data circuit can be increased in scale as needed so that the bit width takes a desired bit width.

Table 6 shows the type of each control code to be used for operation control of the test data generation circuit 15, which is defined and described in the data generation code field MFf lying within the microcommand, and the contents thereof. In Table 6, commands represented in the same rules as those for the commands given in Tables 3 through 5 are substantially similar commands.

Tp←Tp*2 is a command for controlling the register Tp and the arithmetic and logic unit ALU to process 18-bit data lying within the register Tp with the arithmetic and logic unit ALU, thereby to shift a bit string to the MSB side or LSB side by one bit and returning it to the register Tp. Even if the memory unit is a memory of a type wherein the reading and writing of data is performed in units of one word or one byte according to this command, test data for writing data "1" into each memory cell by one bit can be generated with relative ease.

TABLE 6

| Tp output | Operation |
|---|---|
| Tp←Tp | Non Operation |
| Tp←0 | 0→Tp |
| Tp←Tphold | Tphold→Tp |
| Tp←Tp*2 | Shift left |

One example of a list of microinstructions or microcommands related to a marching test corresponding to one of memory testing methods is shown in Table 7.

The marching test is performed as follows: One bits are selected from all the bits for each individual memory cells lying within the memory array 1 in order. Data of "0" is written into the selected memory cell. Thereafter, the data of "0" written therein is read out. Subsequently, one bits of all the bits are selected in order. Data of "1" is written into the selected memory cell. Thereafter, the written data of "1" is read and the respective read data are compared with an expected value to thereby determine the presence or absence of a defect.

The marching test will be explained as an example assuming that an X address is 4 bits, an Y address is 4 bits and a memory array having a storage capacity of 256 bits is used.

| PC | Op code | PC address | Control command and the like |
|---|---|---|---|
| 0 | nop | | Xbase←Xhold Ybase←Yhold Tp←Tphold |
| 1 | jindex1 | 1 W | X←Xbase Y←Ybase Xbase←Xbase+1 Ybase←Ybase+1(BR) |
| 2 | nop | R | X←Xbase Y←Ybase |
| 3 | jindex1 | 2 W | X←Xbase Y←Ybase Xbase←Xbase+1 Ybase←Ybase+1(BR) Dinvert |
| 4 | jindex1 | 4 R | X←Xbase Y←Ybase Xbase←Xbase+1 Ybase←Ybase+1(BR) Dinvert |
| 5 | jxd | 1 | |

In Table 7, symbols W and R respectively indicate control codes for giving instructions for the read/write effected on each memory, which are defined and described in the control field MFd. The control codes are expressed in a bit corresponding to W and a bit corresponding to R, i.e., two bits. Numerals described in the column of "PC address" indicate jump destination addresses and means that a microcommand designated at numeral described in the column of PC is taken after the execution of the corresponding microcommand to thereby execute a loop or jump. Symbols X←Xbase and Y←Ybase described in the column of "Control command and the like" means that the values of the base registers Xbase and Ybase are respectively outputted as an X address and a Y address.

Figure 8:
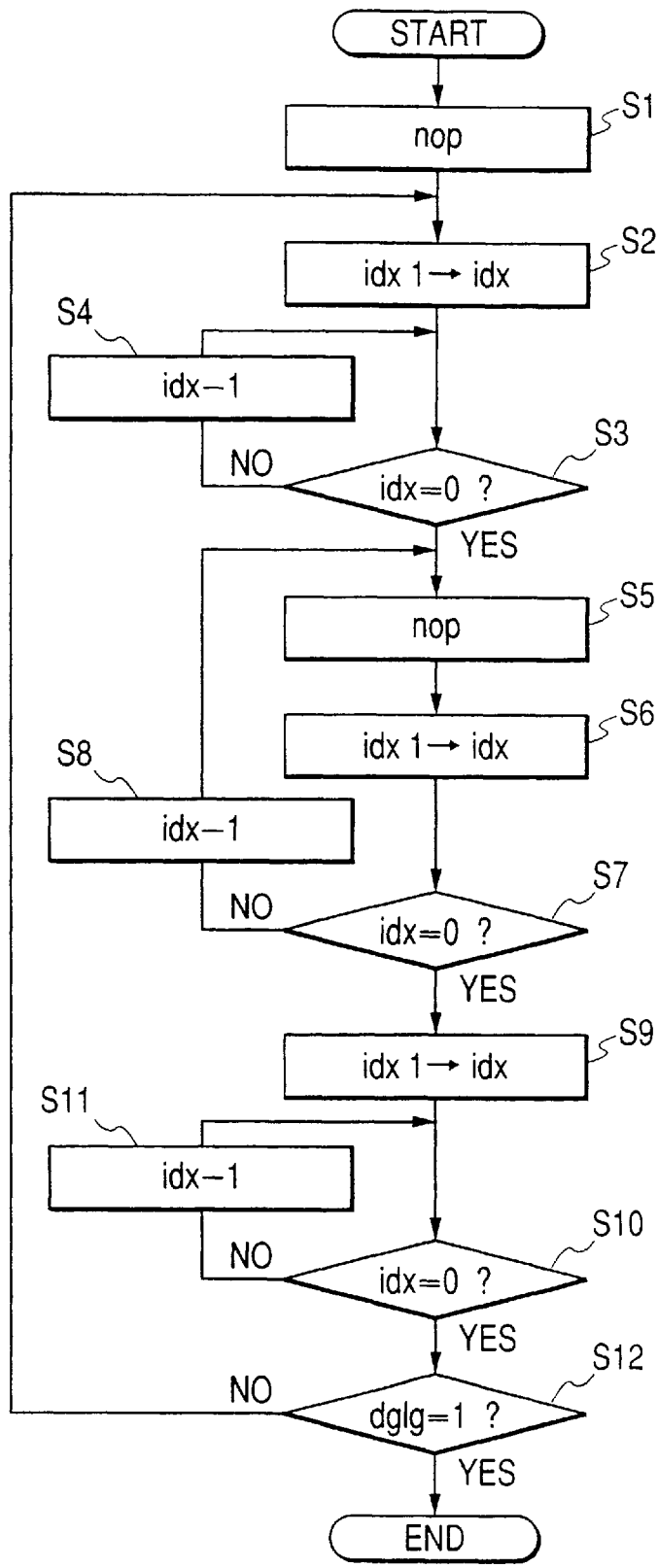
FIG. 8 is a flowchart illustrating one example of a sequence control procedure based on an op code and an operand of a microcommand for a test circuit used when a memory array is checked.
Figure 9:
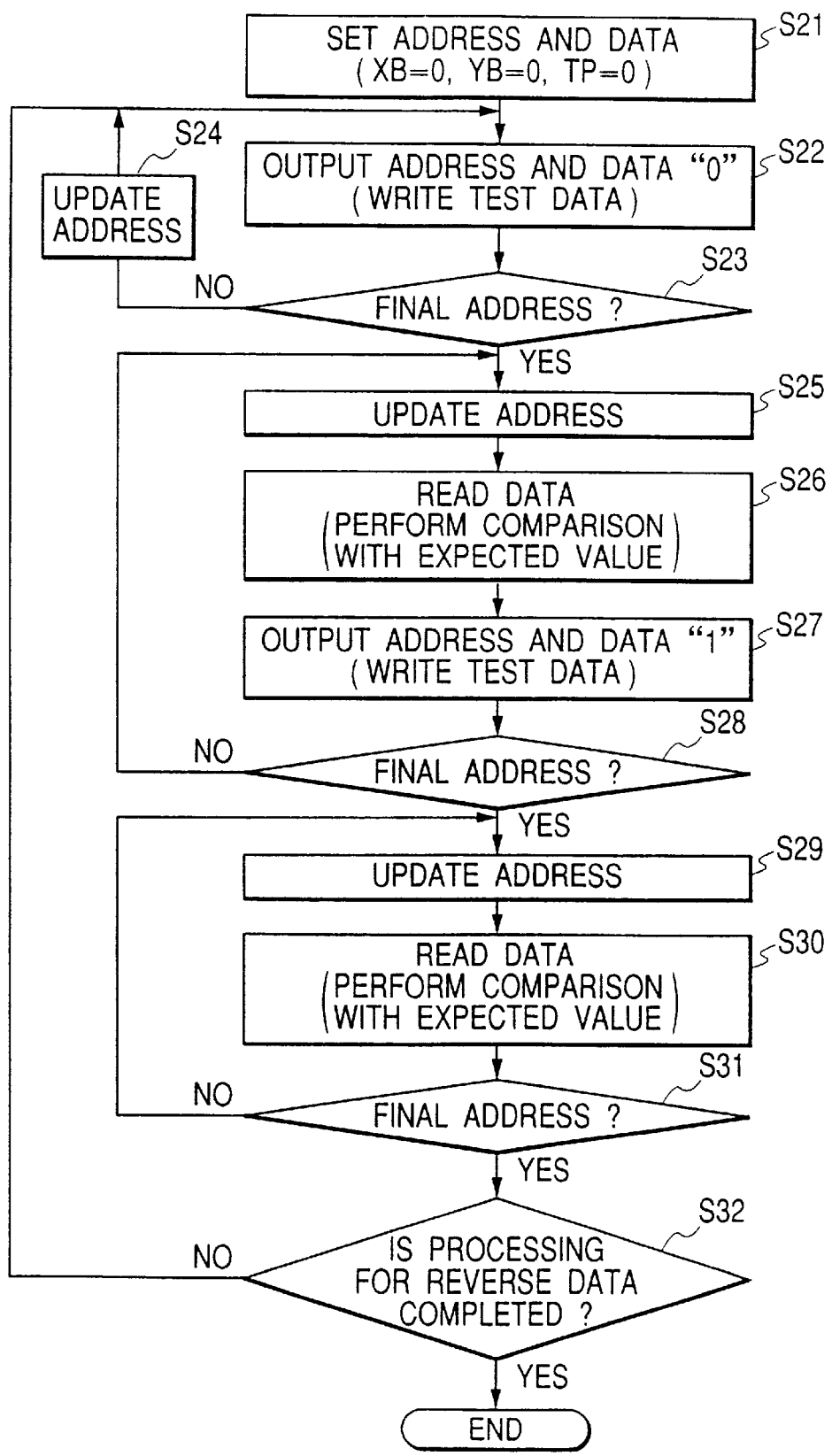
FIG. 9 is a flowchart depicting one example of a procedure for generating and outputting a test address and data according to an operation code and data generation code of a microcommand for a test circuit used when a memory array is checked.

FIGS. 8 and 9 respectively show one examples of processing flows executed in accordance with the micro instruction or command list shown in Table 7 where the marching test of the memory array 1 is performed by the test circuit 10 comprised of the microprogram controlled control unit and the arithmetic unit. Of these, FIG. 8 shows a flow for sequence control based on an op code and an operand lying within a microcommand. FIG. 9 shows a flow for generating test addresses and test data (write data and expected value data) based on an address operation or computation code and a data generation code, which is executed in parallel to the flow for the sequence control shown in FIG. 8. These processes can be executed by activating the sequence control circuit 13, address arithmetic circuit 14 and data generation circuit 15 through the use of the command codes described in Tables 1 through 6 referred to above.

A procedure for the marching test will be explained below while respective steps shown in FIGS. 8 and 9 are associated with one another.

When the address for the initial command shown in Table 7 is externally set to the program counter 12 as a start address, the flows illustrated in FIGS. 8 and 9 are started. When the initial microcommand shown in Table 7 is first read from the instruction memory 11, the sequence control circuit 13 simply advances the program counter 12 by one without any operation because the op code is given as "nop" (Step S1) On the other hand, the address arithmetic circuit 14 and the data generation circuit 15 respectively set the initial values "0" stored in the initial value registers Xhold, Yhold and Thold to their corresponding base registers Xbase, Ybase and Tp (Step S21).

Since the program counter 12 has been incremented in Step S1, a second microcommand shown in Table 7 is next read. Since the op code of the second microcommand is given as "jindex1", the sequence control circuit 13 sets the number of times the operand is repeated, to its corresponding index register idx1 (Step S2).

The initial set value of the index register idx1 corresponds to the capacity (the number of bytes or number of words) of the memory array 1. On the other hand, the address arithmetic circuit 14 outputs the values of the base registers Xbase and Ybase as X and Y addresses according to the operation codes X←Xbase and Y←Ybase respectively. The value "0" of the register Tp is outputted from the data generation circuit 15. At this time, a control signal W (write) is outputted. Thus, each memory cell corresponding to the X and Y addresses outputted from the address arithmetic circuit 14 is selected and data "0" is written therein in the memory array 1 (Step S22).

The sequence control circuit 13 decrements the value of the index register idx1 according to the op code "jindex1" and puts the decremented value into its corresponding working register idxw, and repeats the same command until it reaches "0" (Steps S3 and S4).

Further, the address arithmetic circuit 14 increments the value of the base register Xbase, i.e., an X address according to the operation code Xbase←Xbase+1 and increments a Y address according to the operation code Ybase←Ybase+1 (BR) when the value of the base register Xbase reaches a maximum value. Since the initial set value of the index register idx1 is identical to the capacity of the memory array 1, data "0" is written into all the memory cells lying within the memory array 1 in order by the above-described repetition of operation (Steps S23 and S24).

When the value of the working register idxw reaches "0", the sequence control circuit 13 increments the value of the program counter 12 and reads a third microcommand shown in FIG. 7. Since the op code thereof is "nop", the sequence control circuit 13 advances the program counter by one without any operation (Step S5).

On the other hand, the address arithmetic circuit 14 increments X and Y addresses according to an operation code of the third microcommand and outputs the values stored in the base registers Xbase and Ybase as the X and Y addresses respectively. At this time, the values of the base registers Xbase and Ybase are already returned to "0". The data generation circuit 15 outputs "0" at this time. Further, a control signal R (read) is outputted according to the control code of the control field MFd. Thus, data for the corresponding address is read and compared with the expected value data "0" (Steps S25 and S26).

Since the program counter 12 has been incremented in Step S5, a fourth microcommand shown in Table 7 is next read. Since the op code of the fourth microcommand is given as "jindex1", the sequence control circuit 13 sets the number of times the operand is repeated, to its corresponding index register idx1 (Step S6). The initial set value of the index register idx1 corresponds to the capacity (the number of bytes or number of words) of the memory array 1. However, since the jindex1 command code of the fourth command has a PC address (jump destination address) different from that for the jindex1 command code of the second command, the fourth command is returned to the third command after its execution (the op code is returned to "0").

On the other hand, the address arithmetic circuit 14 outputs the values of the base registers Xbase and Ybase as X and Y addresses according to the operation codes X←Xbase and Y←Ybase respectively. Data "1" obtained by inverting the value "0" of the register Tp is outputted from the data generation circuit 15 according to a data generation code Dinvert. At this time, a control signal W (write) is outputted. Thus, the data "1" is written into memory cells corresponding to the outputted X and Y addresses in the memory array 1 (Step S27).

The sequence control circuit 13 decrements the value of the index register idx1 according to the op code "jindex1" and puts the decremented value into its corresponding working register idxw. Thereafter, the sequence control circuit 13 is returned to the "nop" command and repeats it until the value reaches "0" (Steps S7 and S8). Further, the address arithmetic circuit 14 increments the value of the base register Xbase, i.e., an X address according to the operation code Xbase←Xbase+1 and increments a Y address according to the operation code Ybase←Ybase+1 (BX) when the value of the base register Xbase reaches a maximum value. Since the initial set value of the index register idx1 is identical to the capacity of the memory array 1, data are read from all the memory cells lying within the memory array 1 in order according to the above-described procedure and compared with an expected value, after which the operation for writing "1" into each corresponding address is repeated (Steps S27 and S28).

Next, a fifth microcommand shown in Table 7 is read. Since the op code of the fifth microcommand is given as "jindex1", the sequence control circuit 13 sets the number of times the operand is repeated, to its corresponding index register idx1 (Step S9). The initial set value of the index register idx1 corresponds to the capacity (the number of bytes or number of words) of the memory array 1. The fifth jindex1 command code has the same PC address as that for the second jindex1 command code and is given as a command for repeating the same command. On the other hand, the address arithmetic circuit 14 outputs the values of the base registers Xbase and Ybase as X and Y addresses according to the operation codes X←Xbase and Y←Ybase respectively. Data "1" obtained by inverting the value "0" of the register Tp is outputted from the data generation circuit 15 according to a data generation code Dinvert. At this time, a control signal R (write) is outputted. Thus, data is read out from each memory cell designated by the outputted X and Y addresses in the memory array 1 (Step S29).

The sequence control circuit 13 decrements the value of the index register idx1 according to the op code "jindex1" and puts the decremented value into its corresponding working register idxw. Thereafter, the sequence control circuit 13 repeats the "jindex1" command until the value reaches "0" (Steps S10 and S11). Further, the address arithmetic circuit 14 increments the value of the base register Xbase, i.e., an X address according to the operation code Xbase←Xbase+1 and increments a Y address according to the operation code Ybase←Ybase+1(BR) when the value of the base register Xbase reaches a maximum value.

Since the initial set value of the index register idx1 is identical to the capacity of the memory array 1, data are read from all the memory cells lying within the memory array 1 in order by the above-described repetition of operation and compared with an expected value "1" (Steps S30 and S31).

Next, a sixth microcommand shown in Table 7 is read. Since the op code of the sixth microcommand is "jxd", the program is jumped to a jump destination address by a PC address lying within the corresponding address field MFc in the sequence control circuit 13. In the present embodiment, the program is returned to the second command "jindex1" shown in Table 7. When the jindex1 command is read again, the flag dflg is set to "1". Thus, the answer is determined as "YES" in Step S12 of FIG. 8 upon a second round sequence process, after which the marching test is ended.

On the other hand, upon execution of a second round microcommand list, the write data and expected value data are continuously written into all the bits as "1" by the data generation circuit 14 in Steps S22 through S31 of FIG. 9. Further, the written data are read by one bit and inverted data "0" is written therein. Thereafter, the continuous reading of the data from all the bits is performed. In the flow shown in FIG. 9, determination (reverse data end determination) as to whether the writing and reading of data opposite to the above-described first round in Steps S22 through S31 are completed, is performed in Step S32. Incidentally, reverse data generation for performing an inspection based on the reverse data is performed under the control of INVERT and dflg of Thold shown in FIG. 7.

As described above, the control made according to the flows shown in FIGS. 8 and 9 allows the execution of the marching test according to the only six microcommands by describing the microcommands in the instruction memory 11 for purpose of a command list of the next Table 7, using the command codes described in Tables 1 through 6.

Further, the test circuit 10 employed in the embodiment can execute an all "0" determination test or an all "1" determination test for inspecting whether "0" or "1" can be written into all the memory cells, a so-called $N^2$ pattern test (or a galloping test) for writing "1" into a given bit and thereby inspecting all the bits as to whether other bits are miswritten, etc. in addition to the marching test by using the command codes described in Tables 1 through 6.

A microcommand list for the $N^2$ pattern test is shown in Table 8. Incidentally, ixd is a command for controlling an inverter INVERT controlled by a flag dflg placed under the initial value register Tphold to thereby generate a reverse test pattern. When the flag dflg is 0, the value of the initial value register Tphold is stored in its corresponding register Tp as it is, whereas when the flag dflg is 1, its reverse pattern is set to the register Tp.

TABLE 8

| PC | Op code | PC address | Control command and the like |
|---|---|---|---|
| 0 | nop | | Xbase←Xhold Ybase<Yhold Tp<Tphold |
| 1 | jindex1 | 1 W | X←Xbase Y←Ybase Xbase←Xbase+1 Ybase←Ybase−1 (BR) |
| 2 | jindex1 | 2 R | X←Xbase Y←Ybase Xbase←Xbase+1 Ybase←Ybase−1 (BR) |
| 3 | nop | W | X←Xbase Y←Ybase Xbase←Xbase+1 Ybase←Ybase−1 (BR) Xcurrent←Xbase Ycurrent←Ybase Dinvert |
| 4 | jindex1 | 4 R | X←Xbase Y←Ybase Xbase←Xbase+1 Ybase←Ybase−1 (BR) |
| 5 | jindex2 | 3 R | X←Xcurrent Y←Ycurrent Xcurrent←Xcurrent+1 Ycurrent← Ycurrent+1(BR) Dinvert |
| 6 | jxd | 1 | |

In the above-described embodiment, the value initially set to the program counter 12 can be changed to the command addresses of the initial microcommands shown in Tables 7 and 8 so as to start the marching test and $N^2$ pattern test.

Incidentally, it is desirable that a self-checking function for performing a logic inspection of the test circuit itself is included in the test circuit 10. In the semiconductor integrated circuit wherein the logic circuit is formed over one semiconductor chip together with the memory, the test circuit may be constructed so as to include the function of being capable of generating not only the test pattern for the memory unit but also the test pattern for the logic circuit.

In the above-described embodiment as described above, a test circuit comprised of a microprogram controlled control unit and an arithmetic unit for generating a test pattern (addresses and data) for a memory in accordance with each predetermined algorithm and reading data written into the memory, and data determining means for determining the read data and outputting the result of determination is provided over a semiconductor chip over which the memory like a semiconductor memory circuit is mounted or formed. Owing to the provision of the test circuit 10, internal tests based on all the determining methods for the memory can be done without using an external tester. It is thus unnecessary to provide external terminals (pins) for inputting each test pattern over the semiconductor chip.

Further, since the test circuit formed over the same semiconductor chip as the memory is formed by the same manufacturing technology, i.e., the same generation circuit as the memory, the same operating speed as the memory to be tested can be easily implemented. It is therefore possible to execute testing for the memory in real time and in a short time. Since parallel processing using a plurality of the same circuits becomes unnecessary, the test circuit can be reduced in scale as compared with the tester. It is therefore possible to implement the formation of the test circuit on the semiconductor chip in on-chip form.

Further, a test pattern generator (ALPG) employed in the embodiment can be described in an HDL (Hardware Description Language) by which a computer is capable of recognizing it. Namely, since the test pattern generator (ALPG) can be constructed by software, the computer can verify whether the memory operates properly, after the design of a system and before the fabrication of a chip where a semiconductor memory or a semiconductor integrated circuit with the built-in semiconductor memory is newly developed, an effect is brought about in that the period necessary for the development of the semiconductor memory can be greatly reduced.

In a semiconductor integrated circuit wherein a redundant circuit having a spare memory row or a spare memory column capable of being replaced by a defective bit is provided around a memory, the control unit is constructed so as to have an algorithm for selecting the most suitable spare memory row or spare memory column, based on the result of determination by the data determining means and replacing it with the defective bit. There is further provided a self-healing or -repairing circuit for performing address conversion for the replacement of the defective bit in accordance with the algorithm. Therefore, an effect is brought about in that since all of the processes from the detection of the defective bit to the replacement of the defective bit with the spare memory cell can be performed inside the semiconductor chip, the external tester becomes unnecessary and the scale of a production line can be reduced.

The inventions, which have been made above by the present inventors, have been described specifically by the embodiments. However, the present invention is not necessarily limited to the embodiments. It is needless to say that various change can be made thereto within the scope not departing from the substance thereof.

For example, the section comprised of the test circuit and the comparison determination circuit employed in the embodiment may be formed over a semiconductor chip separated from the memory as an independent semiconductor integrated circuit. Owing to the formation of the section as such a testing IC, a test on a device or the like called "memory module" manufactured with a plurality of Ics mounted on a substrate can be simplified.

Incidentally, there has recently been proposed a memory constructed such that when a command is given from the outside, data is written into a flash memory or the like under its internal control. This seems to be similar to the present invention at a glance. However, the control for writing the data into the flash memory corresponds to the function of repeatedly performing write operation because one write operation no allows each memory cell to reach greater than or equal to a predetermined threshold level. An address signal for selecting each memory cell provided to be written and write data are both externally given. Thus, the above-described memory is clearly distinguished from a memory to which the present invention provided with an arithmetic circuit thereinside and having the function of computing an address for selecting each memory cell and data to be written, is applied.

INDUSTRIAL APPLICABILITY

While the invention made by the present inventors has principally been described above as an illustrative example by a test circuit employed in a memory or a semiconductor integrated circuit with a built-in memory, which belongs to application areas having the background of the invention, the present invention is not necessarily limited to it. The present invention can be utilized for a semiconductor integrated circuit requiring a large number of combinations of test patterns, which is, for example, a PLA (Programmable Logic Array) or another circuit having regularity.

What is claimed:

1. A method of checking a memory circuit in a semiconductor integrated circuit formed on a semiconductor chip, wherein said memory circuit is comprised of a plurality of mats, the method comprising the steps of:

forming a test circuit including a data processing circuit on the semiconductor chip, said data processing circuit being comprised of:
a microprogram controlled control circuit with a microprogram memory storing a predetermined algorithm, which generates a control signal for checking said memory circuit in accordance with said predetermined algorithm and reads written data, wherein said predetermined algorithm includes one of an algorithm for an all "0" determination test, an algorithm for an all "1" determination test, an algorithm for an $N^2$ pattern test and an algorithm for a marching test,
an arithmetic circuit which forms test data according to said control signal from said control circuit, and
data determining means which determines data read from said memory circuit and outputs the result of determination;
checking said mats using the test circuit in accordance with the predetermined algorithm; and
using a mat judged to be free of a defect as a memory which stores the results of determination of other mats therein.

2. A method according to claim 1, further comprising the steps of:

forming said microprogram memory as an electrically programmable nonvolatile memory, and
storing into said microprogram memory said predetermined algorithm which is one algorithm selected from the algorithm for an all "0" determination test, the algorithm for an all "1" determination test, the algorithm for an $N^2$ pattern test and the algorithm for a marching test.

3. A method according to claim 1, further comprising the steps of:

making said predetermined algorithm with a tester language or a test language.

* * * * *